United States Patent [19]

Reddersen et al.

[11] 4,198,701
[45] Apr. 15, 1980

[54] DIGITAL OPTICAL RECORDER-REPRODUCER SYSTEM

[75] Inventors: Brad R. Reddersen, West Melbourne; Richard G. Zech, Satellite Beach; Howard N. Roberts, Indialantic, all of Fla.

[73] Assignee: Harris Corporation of Cleveland, Ohio, Cleveland, Ohio

[21] Appl. No.: 908,726

[22] Filed: May 23, 1978

[51] Int. Cl.$^2$ .................. G11C 11/42; G11C 13/04
[52] U.S. Cl. .............................. 365/127; 360/102; 179/100.3 G; 358/302
[58] Field of Search .................. 365/127; 360/102; 178/6.7 R, 6.7 A; 350/3.5; 179/100.3 G

[56] References Cited

U.S. PATENT DOCUMENTS

| | | | |
|---|---|---|---|
| 3,327,916 | 6/1967 | Weidenhammer | 360/102 |
| 3,582,917 | 6/1971 | Hertrich | 360/102 |
| 3,891,976 | 6/1975 | Carlsen | 365/127 |
| 3,899,778 | 8/1975 | Roberts | 365/127 |

Primary Examiner—Terrell W. Fears
Attorney, Agent, or Firm—Craig and Antonelli

[57] ABSTRACT

A mass archival optical recording and reproduction system includes a recording light source such as a laser beam focussed and directed upon an acousto-optic linear modulator array (or page composer) that receives parallel blocks of data converted from a serial stream of digital data to be stored. The page composer imparts to the laser beam modulation representative of a plurality of parallel channels of data and through focussing optics downstream of the page composer parallel arrays of optical spots are recorded upon a suitable recording medium such as a photographic film floppy disc. The recording medium may be substantially frictionlessly and stably positioned for recording at a record/read station by an air-bearing platen arrangement which is preferably thermodynamically non-throttling so that the recording film may be positioned in the path of the information-carrying light beam in a static or dynamic mode.

During readout, the page composer is bypassed and a readout light beam is focussed directly upon the recording medium containing an array of previously recorded digital spots, a sync bit, data positioning bits, and a tracking band. The readout beam which has been directed through the recording medium is then imaged upon a photodetector array, the output of which may be coupled to suitable electronic processing circuitry, such as a digital multiplexer, whereby the parallel spot array is converted back into the original serial data stream.

26 Claims, 6 Drawing Figures

DIGITAL OPTICAL RECORDER-REPRODUCER SYSTEM

The invention described herein was made in the performance of work under NASA Contract No. NAS 8-30564 and is subject to the provisions of Section 305 of the National Aeronautics and Space Act of 1958 (72 Stat 435; USC 2457).

FIELD OF THE INVENTION

The present invention is related generally to an improved method and apparatus for storing and retrieving digital data through the use of high density optical information storage techniques, and is particularly directed to an optical mass archival recording and reproduction system in which serial digital data may be recorded in parallel data bursts and subsequently reproduced through a highly accurate data tracking and retrieval scheme.

BACKGROUND OF THE INVENTION

The continuing development of high density data storage and retrieval systems has seen the expansion and refinement of digital data processing systems which may incorporate magnetic or optical digital storage components as part of an overall system. In the field of optical storage systems, holographic recording/reproduction and direct digital optical storage systems have undergone a considerable degree of refinement, both with respect to general system design and operation as well as system components such as page composers, photodetector arrays, recording materials, and media transport and handling devices.

For a non-limitative illustration of various types of optical storage systems and the components that may be employed in such systems, attention may be directed to the following U.S. Pat. Nos., which exemplify various facets of optical recording and read-out systems which merit consideration when considering the overall objectives of an intended scheme of mass data storage: Ohta et al 3,911,410; Bricot et al 4,059,841; Kiemle 3,868,658; Takeda et al 4,021,606; Bardos 3,964,032; Nopper 3,919,560; Boucher 3,612,888; Zorn 3,975,630; Adler 3,715,524; Aschenbrenner et al 3,438,050; Russell 3,501,586, 3,624,284, 3,795,902, 3,806,643, 3,891,794, 3,885,094, 3,941,927, 4,015,286 and 4,050,811; and Walker 3,919,697.

SUMMARY OF THE INVENTION

The present invention is directed to a mass archival optical recording and reproduction system capable of recording and reproducing digital information at a high transfer rate accompanied by a high information storage density through a novel combination of optical storage and retrieval components which effectively makes optimum use of optical signal formatting, and data tracking and recording techniques presently available and augmented by components not heretofore employed. To this end, the recording portion of the system in accordance with the present invention incorporates a suitable recording light source, such as a collimated laser beam, which is appropriately focussed and directed upon an optical modulator, such as an acousto-optic page composer, that receives parallel blocks of data converted from a serial stream of digital data to be stored. The page composer imparts to the laser beam modulation representative of a plurality of parallel channels of data and through focussing optics downstream of the page composer parallel arrays of optical spots are recorded upon a suitable recording medium such as a photographic film in a format such as a strip, floppy disc, etc. The recording medium may be substantially frictionlessly and stably positioned at a record/read station by an air-bearing platen arrangement which is preferably thermodynamically non-throttling so that the recording film may be positioned in the path of the information-carrying light beam in a static or dynamic mode. In addition to the parallel channels of data, also recorded on the film are data positioning bits, a multiplexing synchronization signal, and a tracking band which permits the reproduction portion of the system to accurately track and reproduce the optically recorded data back into its original form. Fidelity of the optical spot recordings to the original data may also be monitored by imaging the optical spot array recorded on the recording medium onto a photodetector array, the output of which is coupled, together with the original parallel data channels, to a comparator, so as to verify that the data intended to be recorded has actually been recorded.

The reproduction portion of the inventive system, which is quite similar to the data recording optics, contains a suitable readout light beam source, such as a laser and associated beam-forming optics. During readout, the page composer is bypassed and the readout light source is focussed directly upon the recording medium containing the array of previously recorded signal spots, a sync bit, data positioning bits, and a tracking band. The readout beam which has been directed through the recording medium is then imaged upon a photodetector array, the output of which may be coupled to suitable electronic processing circuitry, such as a digital multiplexer, whereby the parallel spot array is converted back into the original serial data stream. The photodetector array may be electronically or mechanically agile so as to permit imprecisely located reproduced bits to be read accurately. In order to ensure accurate illumination of the photodetector array with the recorded image, band tracking optics monitor the data tracking or positioning band and supply a servo-control signal to the photodetector array imaging system components so as to maintain the optical spot image within the field of detection of the array. Also, a substantially frictionless film support structure, such as an air-bearing platen of the type used in the recording portion of the system, may be incorporated in the reproduction portion of the system to provide an accurate and stable positioning of the recording medium in the path of the readout beam, regardless of the mode of operation of the system.

By adopting a combination of system components as described briefly above, the optical recording and reproduction system in accordance with the present invention is capable of achieving an exceptionally high information storage density effected using multiple channel recording to achieve data storage at a very high data rate.

DETAILED DESCRIPTION

Recording System

Figure 1:
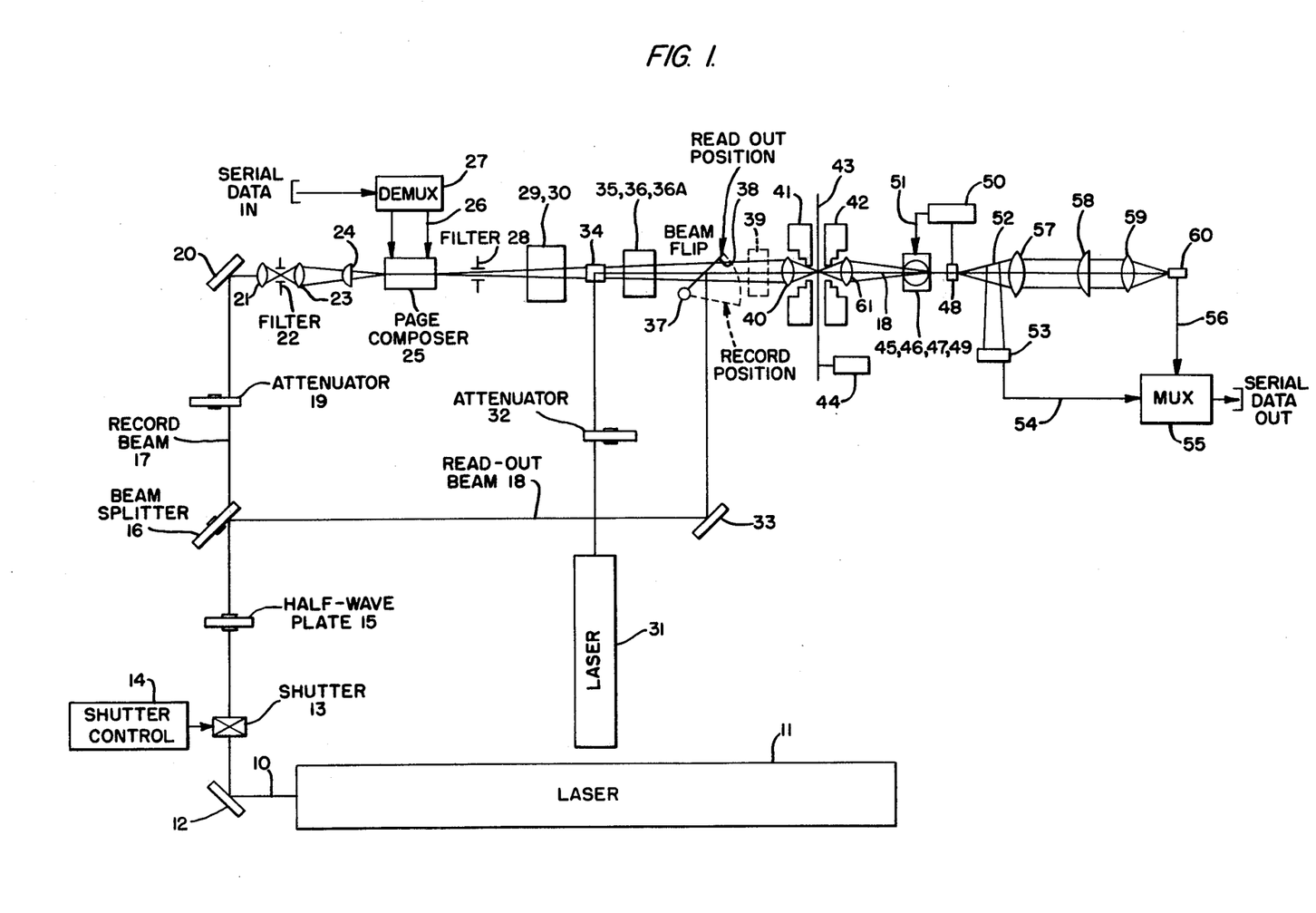
FIGS. 1 and 2 are respective top and side views of an optical digital data recording/reproduction system in accordance with the present invention.
Figure 2:
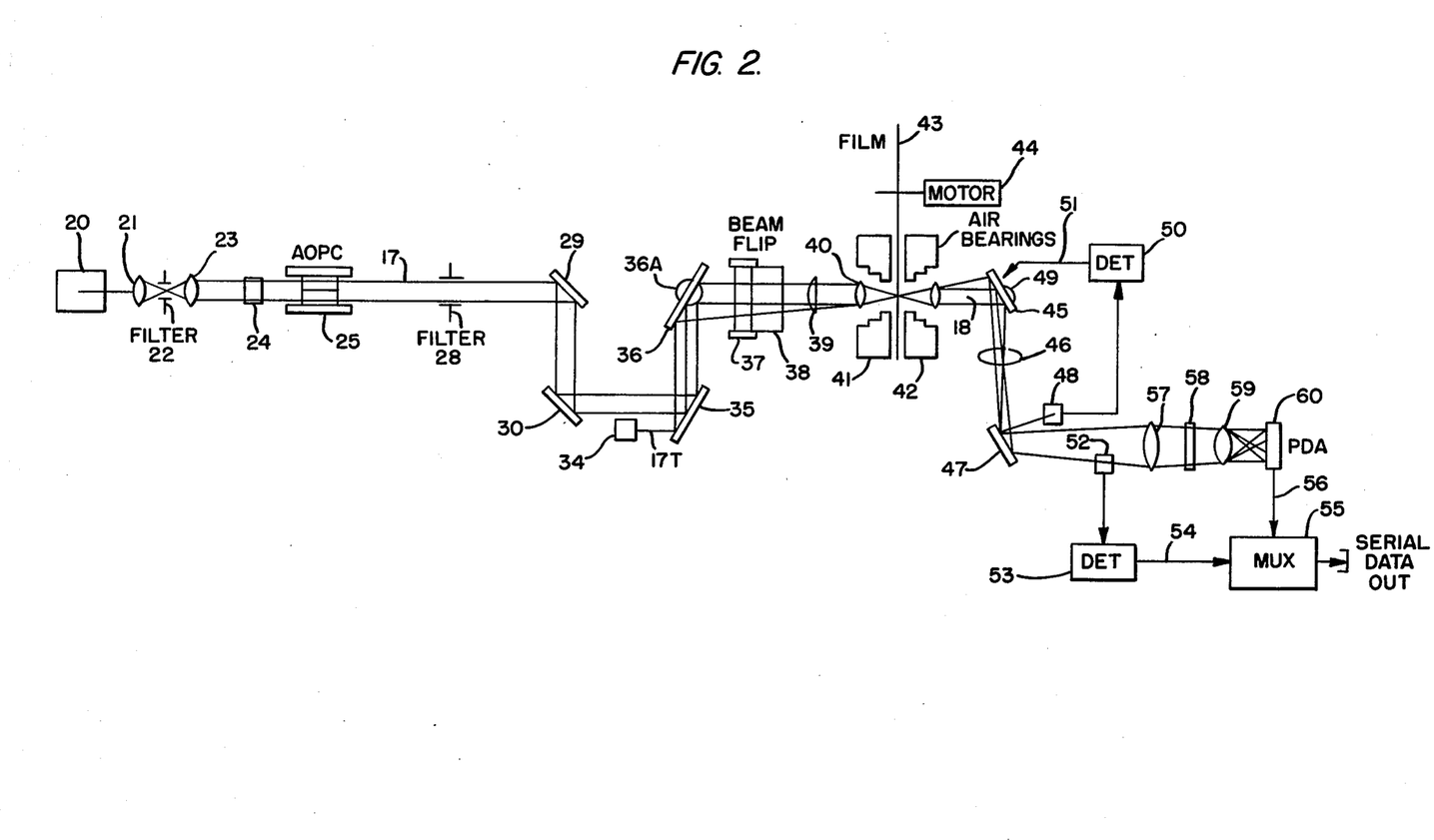

Referring to FIGS. 1 and 2, there are illustrated respective top and side schematic optical block diagram views of components of the recording/reproduction system in accordance with the present invention. As a source of both a recording and a reproduction light beam, there may be provided a laser 11 which produces a linearily polarized output beam 10. Beam 10 is reflected by mirror 12 and selectively passes through shutter 13 and half-wave plate 15. Shutter 13 may be controlled by a suitable shutter control circuit mechanism 14 to selectively switch laser beam 10 on and off and thereby control the length of time that a beam is supplied to the recorder and readout optics portions of the systems. Half-wave plate 15 rotates the linear polarization angle of beam 10 so that the light existing from the half-wave plate 15 is polarized at an angle of 45° (relative to the plane of FIG. 1). This ensures that the light incident on page composer 25 (to be described below) may match the polarization angle of the acousto-optic crystal contained in the page composer 25 and thereby achieve a maximum diffraction efficiency. For other acousto-optic materials, half-wave plate 15 may not be required. From half-wave plate 15, beam 10 impinges upon beam splitter 16 to be separated into a pair of beams 17 and 18. Beam 17 is employed as the recording beam, while beam 18 may be used for reading. out the information stored in the optical recording medium, to be described below.

The intensity of recording beam 17 may be adjusted by attenuator 19 to a level appropriate for recording, and thereafter focussed onto an optical modulator system through which information to be recorded is imparted to recording beam 17. For this purpose, upon exiting attenuator 19, recording beam 17 is reflected by mirror 20 through a beam shaping optics arrangement comprising a lens 21 which may be a suitable microscope objective, a filter or aperture stop 22, a lens 23 which may consist of a spherical lens, and a cylindrical lens 24. This beam-shaping set of optical elements causes beam 17 to be formed into a beam having a thin strip-like or line-like cross-section of sufficient width to illuminate an acousto-optic page compser 25 through which beam 17 is spatially modulated. Page composer 25 may comprise a thirty-two element acousto-optic page composer fabricated with a $TeO_2$ acousto-optic crystal or other acousto-optic material having a plurality (a maximum of thirty-two for the example chosen) of parallel input leads 26 connected to the respective parallel-arranged electrodes disposed on the surface of the acousto-optic material of the page composer. For purposes of describing an exemplary embodiment in the description to follow, eleven of the thirty-two bits or modulation channels available may be used for recording purposes. Eight of the eleven bits may comprise the data bits to be recorded in parallel, two additional bits may constitute a data byte boundary identification code, with the remaining bit corresponding to a synchronization bit. The precise function and format of these bits will be described more fully hereinafter.

Figure 3:
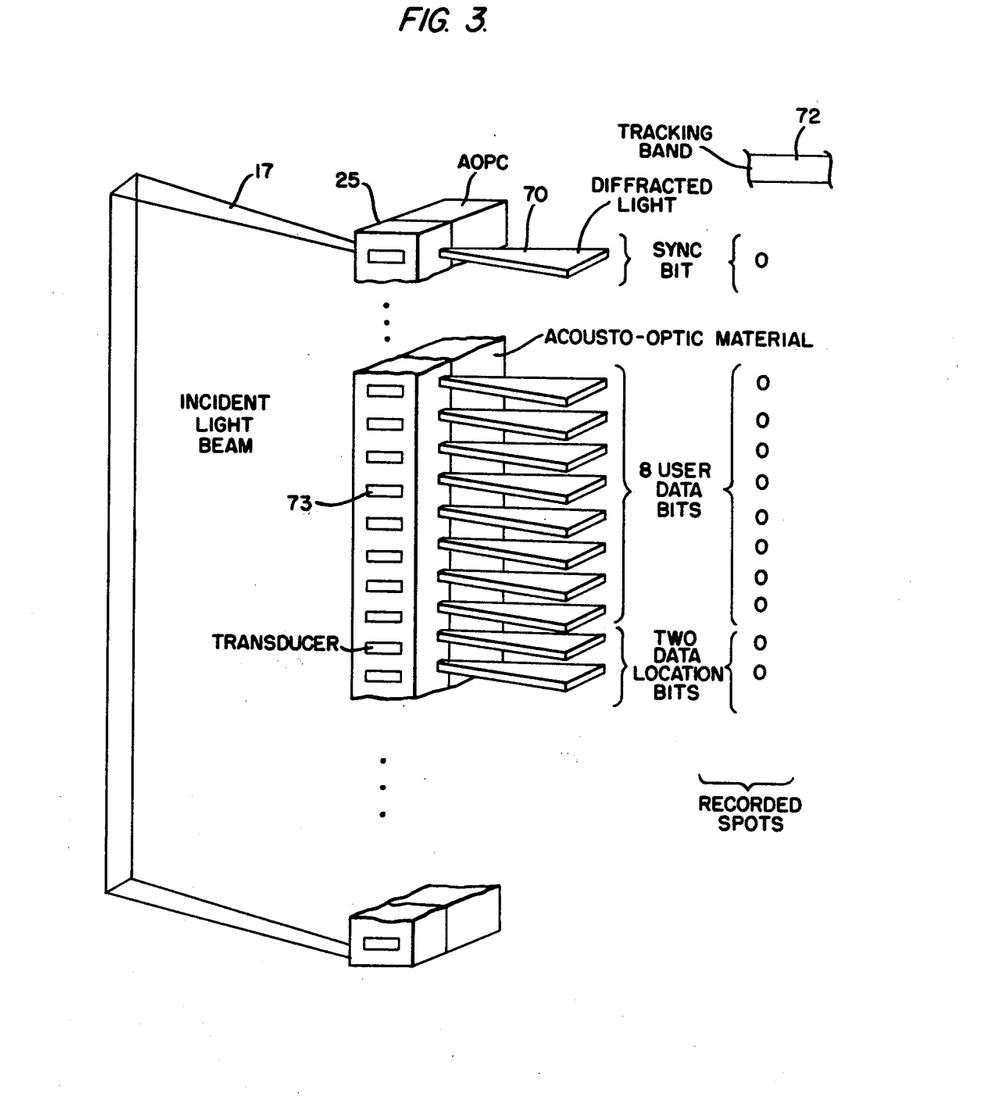
FIG. 3 is a partial illustration of an acousto-optic page composer and the record of a frame of data produced by the composer and associated tracking band optics.

The parallel inputs of page composer 25 may be coupled via leads 26 to the parallel outputs of a suitable serial-parallel demultiplexer 27. Demultiplexer 27 may be coupled to receive a suitable clock control signal and a digital data signal in serial format and convert the serial data signals into parallel output signals to be supplied to page composer 25 over leads 26. In order to achieve a one megabit per second data rate, for a parallel format of eight bits per byte, demultiplexer 27 is clocked at a frequency of 125 kHz. As was mentioned briefly above, a selected number of the inputs of page composer 25 may be defined as data position inputs so that the beginning or end of a group of serial digital data signals which have been converted into parallel format by demultiplexer 27 may be identified. Thus, in the present example, demultiplexer 27 may convert serial input data bits into parallel output bits in groups of, or bytes of, eight bits per parallel output group (byte) to be coupled to eight of the selected eleven channel inputs of page composer 25. It is to be observed that the number of data bits per byte and the number of data location bits, or even the individual sync bit, used are not limited to the numbers set forth herein which are provided simply for the purpose of providing an illustrative example of the present invention. The number of eight user data bits/byte is a practical number since it readily facilitates coupling of the demultiplexing/multiplexing electronic components of the system to present day digital computer systems that typically employ an eight data bit format. Two of the remaining three bits used may be hardwired to suitable voltage level inputs for establishing a synchronization code pattern which is used repetitively to identify the beginning of each eight bit byte of the serial data pattern by which page composer 25 modulates recording beam 17. The one remaining, or eleventh, bit is used as a synchronization bit for controlling the multiplexing of data which has been previously recorded and is being readout during operation of the reproduction portion of the system. FIG. 3 illustrates the page composer 25 and the selected bits that are used to modulate the recording beam 17, together with the spot pattern that is projected and recorded upon the recording medium 43.

Acousto optic page composer 25 may comprise a $TeO_2$ crystal or other acousto-optic medium having a plurality of transducers 73 disposed along one face thereof, by way of which respective acoustic waves may be generated within the cyrstal medium and thereby cause selected portions of incident recording beam 17 to be diffracted. Diffracted light beams 70 correspond to first order diffracted beam signals, other orders being omitted from the drawing for purposes of clarity. As is shown in FIG. 3, an end one of the thirty-two transducers may be selected to generate a sync bit 71. Ten other transducers adjacent to each other may be selected to generate the eight user data bits 74 and a pair of data location bits 75. Preferably, that transducer of page composer 25 through which the sync bit 71 is generated in spaced apart from the user data bits 74 and data location bits 75 so that optical detection of the sync bit may be facilitated, as will be described in more detail below in conjunction with the description of the reproduction portion of the system. Those transducers of page composer 25 through which the two data location bits are generated are connected to suitable voltage level inputs which define the data location code pattern. The operation of an exemplary implementation of the photodetector readout portion of the system, to be described below, is such that these data location bits are identified on an agile photodetector array and, using these location bits as a reference, the first bit of the parallel recorded eight bit byte is automatically identified as the first bit adjacent the data location bits, spaced apart therefrom by one bit spacing. The function and control provided by the sync and data location bits will become more apparent during the description of the reproduction portion of the system to follow subsequently.

As beam 17 exits page composer 25 it contains an optically encoded synchronization bit separated from ten other bits adjacent to one another, two of which have been optically encoded to define a data location pattern, and the remaining eight of which have been subjected to selective modulation by page composer 25 in accordance with the parallel data outputs of demultiplexer 27. Recording beam 17 is then selectively filtered by an aperture stop 28 and directed towards a recording medium optics arrangement. For this purpose, a set of mirrors 29, 30, 35, and 36 reflect beam 17 towards a half-cylindrical lens 39 and a focussing lens 40. Mirror 36 may be coupled with a galvanometer 36A to ensure accurate positioning of the recording beam on the focussing lens 40. Galvanometer 36A also makes it possible to record a plurality of data frames on the recording medium 43 by changing the voltage input to the galvanometer in discrete steps. As a result of the focussing action of lenses 39 and 40, beam 17 is converged as a set or series of spots upon a suitable recording medium 43. Using the multichannel page composer and associated focussing optics described above, it is possible to achieve an information packing density in excess of $4 \times 10^6$ bits/cm$^2$ corresponding to spots recorded on 2 to 5 $\mu$m centers. Recording medium 43 may comprise a suitable photographic film in fiche, tape, or floppy disc configuration, or thin metallic members in similar configurations into which the data spots may be permanently formed by selective melting, burning, or cratering of the thin metallic strip. For purposes of the present discussion, it will be assumed that the recording medium 43 is configured as a floppy disc mounted so as to be rotatably driven by motor 44, with the optical image portion of the disc being in the form of an annular ring or band which passes through the focal area of recording beam 17 as motor 44 rotates the disc. The speed of rotation of motor 44 may be appropriately selected in accordance with the radial position of the recording ring portion of the disc and the data rate (1 Mb/s in the example presented) to properly synchronize sequential recording of the parallel data bits around the annular imaging band portion of the floppy disc.

Referring again to the pre-recording optical elements, prior to incidence upon lens 39, recording beam 17 bypasses a rotatable mirror 38 which may be selectively pivoted or rotated about an axis 37 in accordance with the mode of operation of the recording/reproduction apparatus. During the recording mode of operation, rotatable mirror 38 may be pivoted to the lower position shown in broken lines in FIG. 1, so that it effectively blocks read beam 18 as read beam 18 is reflected off mirror 33 towards mirror 38, and permits recording beam 17 to pass unobstructed towards lens 39.

Inserted between mirrors 30 and 35 is a further mirror 34 which is positioned to receive the output beam generated by a further laser 31 and subjected to appropriate intensity level reduction by an attenuator 32. The purpose of this additional beam is to impart a data alignment or tracking band 72 (see FIG. 3) on the recording medium 43 adjacent to, but spaced apart from, one end of the series of spots created by page composer 25, in order that an illuminated image of the data previously recorded may be accurately positioned upon a read-out photodetector arrangement, and thereby facilitate reconversion of the parallel readout data back into its original serial digital form. Thus, mirrors 35 and 36 direct a composite recording beam comprised of a spatially modulated beam 17 and an adjacent tracking band beam 17T, both of which are focussed onto recording medium 43.

In addition to being rotatably driven by motor 44, recording medium 43 may be advantageously stably positioned at the read/record station by a thermodynamically non-throttling air-platen arrangement schematically illustrated in FIG. 2 as comprising a pair of fluid bearing supply elements 41 and 42. Details of this air-platen arrangement are described in a copending U.S. patent application entitled "Air-Platen Bearing" by David C. Bailey and Robert E. Klein, Ser. No. 908,729 filed on even date herewith and assigned to the assignee of the present application. As is described in the above-identified copending patent application, because the air-platen is thermodynamically non-throttling, recording medium 43 may be supported in either a dynamic or static mode without being subjected to physical distortion. Also, since the support structure for the film strip 43 is a fluid bearing, loss of information because of frictional contact with mechanical surfaces is obviated. Although, with the floppy disc recording medium configuration, a rotating motor drive may be employed to advance the medium along a circular path, where other configurations are used for the recording medium, such as a film tape or strip, fiche, etc., displacement or advance of the recording medium for either recording and/or reading out successive frames of data may be accomplished by any suitable drive, such as a motorized advance mechanism, that may engage the medium such as a film strip at edge portion spaced apart from the information containing area of the strip.

Figure 4:
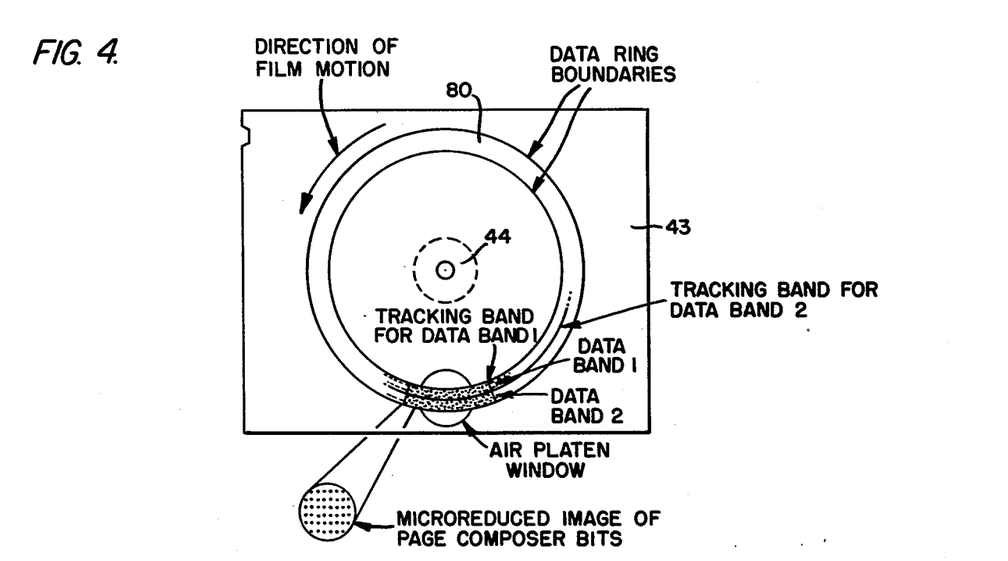
FIG. 4 shows the format of recorded bands of digital data on a floppy disc recording medium.

With the floppy disc configuration for the recording medium 43, each frame of data or a data burst (corresponding to a respective byte of data modulated onto beam 17 by page composer 25) will be recorded together with the data location bits, the sync bit and the tracking band as a line of spots distributed along a respective radial line from the rotational center of the floppy disc and a band or ring segment (corresponding to the tracking band). As each successive frame of data is recorded on the disc during its rotation there is created an annular ring or band of data 80, as illustrated in FIG. 4. Multiple bands of data may be recorded concentrically by stepwise displacement of mirror 36 through galvanometer 36A as described above to enable successive bands of data to be successively radially stacked in the manner shown in FIG. 4. It is to be understood that each of data bands 1 and 2 is comprised of a ring of successive eleven bit frames as illustrated in FIG. 3 described previously together with a data tracking band.

Reproduction System

For the purpose of reading out the information previously recorded on a recording medium, there may be provided enlargement lens 61, such as a microscope objective, disposed on the side of recording medium 43 opposite lens 40. A readout beam 18 from beam splitter 16 is reflected off mirrors 33 and 38 and focussed upon the multiple spot recording area of recording medium 43 by lenses 39 and 40. It is to be noted, as was described previously, that during reproduction or readout, rotatable mirror 38 is pivoted about axis 37 to the position shown in solid lines in FIG. 1, to thereby block the composite recording beams 17, 17T and cause readout beam 18 to illuminate recording medium 43. Upon exiting lens 61, readout beam 18 impinges upon a galvanometer-controlled mirror 45 and is reflected through lens 46, such as a suitable microscope eyepiece, towards mirror 47. Mirror 45 may be rotatably driven by a galvanometer coil 49, the control voltage for which is supplied over lead 51 from a photodetector 50. Photodetector 50 is optically coupled to the tracking band portion of the recording image contained in readout beam 18 by way of mirror 48. Through mirror 48, photodetector 50, and galvanometer 49, the position of mirror 45 is rotatably adjusted to maintain the multispot image of the readout beam within the optical receiving area of photodetector array 60, which receives the readout beam by way of a telescope imaging system comprising lenses 57, 58, and 59. Within this telescope imaging system, lens 58 may be a suitable half-cylindrical lens for limiting the width of the readout beam to the detection area of the individual detection cell areas of the photodetectors of array 60. Photodetector array 60 may be of any suitable agile configuration, such as a mechanically moveable or electronically shiftable or scanned array for detecting the image of the recorded data. An example of an electronically configured array which may preferably be adopted is described in U.S. Pat. No. 3,780,266 to Mudsam et al. An agile photodetector array effects the detection of the respective bits of an imaged data frame while permitting a variation in the location of incidence of the readout beam upon the detector face of the array. Thus, through the combination of an agile photodetector array and the servo-positioning control mirror 45 in response to detector 50 tracking a shift in tracking band 72, the output of photodetector array 60 will accurately represent the data contents of each recorded image, to be supplied to multiplexer 55 over lead 56.

In certain embodiments, servo-positioning control mirror 45, in response to detector 50, may provide position corrections with enough precision to eliminate the need for agility in the photodetector array. In one specific exemplary implementation, agile detector array 60 is comprised of a linear array of self-scanned photodiode detectors of a number sufficient to permit shifts of the imaged light pattern along the array, with the number chosen being such that several detectors are assigned for each bit (or spot) of recroded information to ensure reliable detection of the data. Thus, for the detection of the ten adjacent bits of the eleven bits recorded on each frame produced by the page composer 25, an oversampling factor of four yields a required number of 10×4=40 detector elements. To accomodate a slight amount of data wander on the array (such as caused by light positioning offsets, film distortion, insufficient precision of servo-positioning control mirror 45, etc.) an additional number of detectors at opposite ends of the array may be provided. For a wander of three data spots, a total of twenty-four additional detectors is appropriate, so that the minimum length of the array is sixty-four detectors, thereby assuring detection of the entirety of a data frame.

Further coupled in the path of readout beam 18 is a mirror 52 which is positioned to intercept the synchronization bit of the multiple spot image contained in readout beam 18 and to reflect the synchronization bit to photodetector 53. The output of photodetector 53 is coupled over lead 54 to a parallel-serial multiplexer 55. Multiplexer 55 is further coupled via input lead 56 to photodetector array 60. Under control of the synchronization bit detected by detector 53, multiplexer 55 is synchronized with the reproduction rate of the successively illuminated groups of spots of the successive frames of parallel data which may then be reconverted back into serial format.

Figure 5:
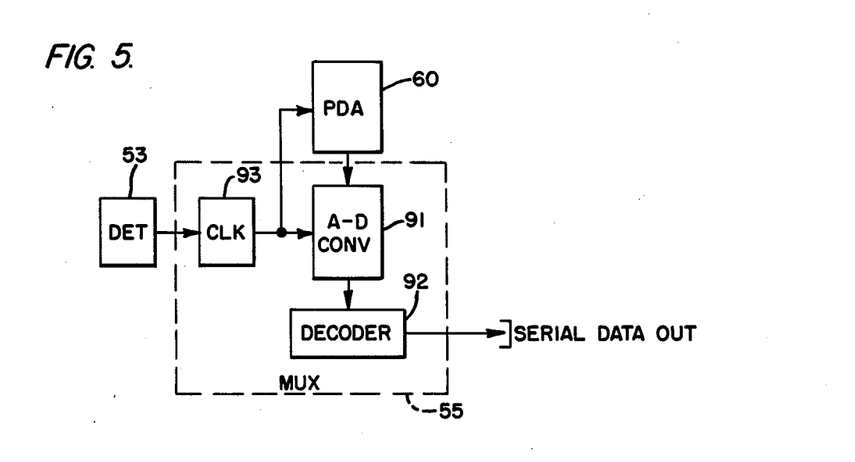
FIG. 5 is a schematic block diagram of the multiplexer digital data recovery circuitry used in the reproduction system.

FIG. 5 illustrates a suitable circuitry configuration for multiplexer 55 through which the outputs of photodetector array 60 are reconverted back into their original serial format. The output of photodetector array 60 is coupled to an analog-digital (A/D) converter 91 which may comprise a sample and hold circuit and an associated voltage level comparator. A/D converter 91 sequentially converts the outputs of the detectors of array 60 into respective digital signals as the detectors are successively scanned, under the control of clock 93. Clock 93 is gated on upon detector 53 detecting the sync bit portion of readout beam 18. The output of A/D converter 91 is coupled to a decoder 92 which detects the initial pair of data location bits and causes the remaining contents of array 60 which have been converted into digital format by A/D converter 91 to be serially read out in eight successive bits representative of the original digital data.

OPERATION

Recording Mode

In the recording mode of operation, rotatable mirror 38 is initially pivoted to the position of the broken lines shown in FIG. 1, to thereby block readout beam 18 and permit only recording beam 17 to illuminate recording medium 43. Serial data to be recorded is supplied to demultiplexer 27 wherein it is converted into parallel format in bytes of eight bits/byte and the parallel output bytes are applied to leads 26 coupled to page composer 25. Page composer 25 also receives a prescribed data-location, two-bit code and a synchronization bit voltage as explained previously with reference to FIG. 3. With shutter control circuit 14 opening shutter 13, recording beam 17 is directed through half-wave plate 15, beam splitter 16, attenuator 19, and beam forming optics 21 through 24 to impinge upon acousto optic page composer 25 wherein beam 17 is spatially modulated with the eleven selected digital bits as illustrated in FIG. 3. After passing through aperture-stop filter 28, recording beam 17 is reflected off mirrors 29, 30, 35, and 36 to be directed, via focussing optics 39 and 40, upon recording medium 43 as it is being transported or advanced by drive 44. At the same time, a data tracking, or wander, band is created by beam 17T emitted by laser 31 suitably attenuated by attenuator 32. Mirror 34 intercepts the data wander band beam and directs this tracking band beam through focussing optics 39 and 40 so that a tracking band is recorded as part of the same frame of data containing the spatial modulation produced by page composer 25. Again, FIG. 3 illustrates the spot array for an individual frame of data including the eleven bits produced by page composer 25 and the data wander or tracking band produced by laser 31. Upon completion of the recording of a frame or data burst, shutter control 14 switches shutter 13 off, as a new byte of data is demultiplexed onto leads 26 by demultiplexer 27 and recording medium 43 continues to be advanced (here rotated in the exemplary floppy disc configuration described) by drive 44. As recording medium 43 rotates to expose a new recording area along a circular band or ring portion of disc 43, the above-described operation is repeated for each successive eight bytes of data, etc., until either a record track on disc 43 has been filled or the serial data input to demultiplexer 27 is terminated. To record further bands or circular tracks of data on the disc, galvanometer controlled mirror 36 may be switched to reposition the imaging area of recording beam 17 and data wander beam 17T, at a new radial distance from the rotational center of disc 43, for further recording on the same medium 43. Upon completion of the recording of a track or pulse tracks or bands of data on disc 43, the same may be removed and a new unexposed film disc coupled to drive 44 for additional recording, as desired.

Reproduction (Readout) Mode

In the readout or reproduction mode of operation, rotatable mirror 38 is pivoted to the position shown in solid line form in FIG. 1, thereby blocking recording and data wander beams 17 and 17T, respectively, and reflecting readout beam 18 through imaging optics 39 and 41 to illuminate a previously recorded band or track of data, including the data wander track, on recording medium 43. Again, shutter control circuit 14 opens shutter 13 in proper synchronization with the advance or rotation of recording medium 43 through the imaging window of readout beam 18 so that an image of a respective frame of data including the data wander track is focussed by lens 61 onto galvanometer-controlled mirror 45. After reflecting off mirror 45 and passing through lens 46, the readout image is reflected off mirror 47. Mirror 48 is positioned to intercept the image of the tracking band contained on the frame of data being read out. Mirror 48 directs the tracking band image to photodetector 50, the output of which is fed back to galvanometer 49 to control the direction in which mirror 45 reflects readout beam 18 through lens 46 and off mirror 47 toward photodetector array 60, and maintain proper incidence of readout image upon photodetector array 60 and thereby correct for any tendency of the image to wander or travel across the photodetector receiving face of the array. In certain embodiments, the amount of correction thus achieved may eliminate the need for agility in the photodetector array.

As readout beam 18 is reflected off mirror 47, absent the intercepted tracking band image, the sync bit portion of the data frame image is intercepted by mirror 52 and directed onto photodetector 53. Accurate interruption of the sync bit portion of the readout beam is achieved by spatially separating the sync bit from the ten adjacent bits containing the user data, so that the mirror 52-photodetector 53 will only look at the sync bit. Final image optics 57-59 focus the remaining image portion of readout beam 18 onto the photodetector array 60, wherein the ten adjacent spot images containing the two data position bits and the eight user data bits are converted into output signals to be coupled to multiplexer 55. As was explained previously in connection with the description of multiplexer 55, in response to the sync bit detected by photodetector 53, the multiplexer clock causes the detected data spot image-representing signals produced by the photodetector array 60 to be sequentially clocked and readout as an eight bit serial digital data stream. As the last bit of each eight bit byte is read out a new data image on the next subsequent data frame recorded on disc 43 is processed in the manner described above, so that successive parallel data bytes are imaged on photodetector array 60 and the originally received digital serial data stream is recovered at the output of multiplexer 55.

Figure 6:
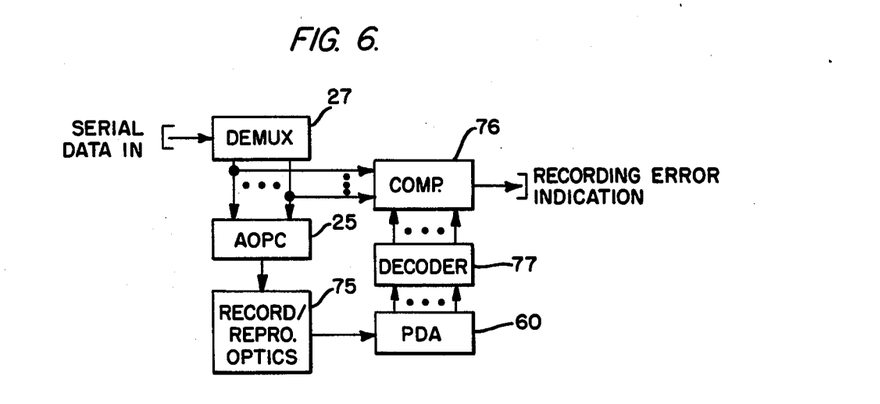
FIG. 6 is a schematic block diagram of recorder data verification circuitry which may be adapted to the recording system in accordance with the present invention

In the foregoing description of an exemplary embodiment of the invention, description was made of the various types of recording materials that may be used for recording medium 43. In addition to the floppy disc configuration of a photographic film member, used in the described embodiment, a thin metallic recording medium deposited on a transparent substrate may be used, with the intensity of the recording beam being controlled to melt, effectively burn, or cause there to be cratered data spots on the metallic film. In this case, it is possible to focus the image created by the recorded spot apertures using the same recording beam to image the data spots onto photodetector array 60 and observe the output of photodetector 60 to verify the accuracy of the recording operation as it proceeds. To this end, as shown in FIG. 6, the data image formed on the recording medium via the recording optics 75, corresponding to the recording and reproduction lens, filter and mirror arrangements shown in FIGS. 1 and 2, is simultaneously projected onto photodetector array 60 as it is formed in the recording medium. The respective outputs of the detector cells of array 60 are decoded in a diode matrix decoder 77 to produce the ten adjacent data position and user data bits supplied to acousto-optic page composer 25 from demultiplexer 27. The outputs of demultiplexer 27 and decoder 77 may be respectively compared in a digital comparator 76 to verify the fidelity of the digital spot data recorded on the recording medium.

As will be appreciated from the foregoing description of the direct digital optical spot recording and reproduction scheme in accordance with the present invention, there is achieved a data storage and retrieval technique that offers a number of improvements over other proposed mass memory technologies. For example, in addition to the advantage of being able to record on archival storage media such as photographic film, the direct digital multichannel spot recording and reproduction system in accordance with the present invention provides very high information storage densities without requiring ultrahigh precision recording and readout techniques. Where 128-bit 10 $\mu m \times 1.0$ mm Fourier-transform holograms on 15 $\mu m$ centers in a typical holographic mass memory yield a local area information storage density of $0.85 \times 10^6$ bits/cm$^2$, optical spots on 3.5 $\mu m$ centers provide an equivalent storage density of $8.2 \times 10^6$ bits/cm$^2$, a gain of almost ten times. In addition, by recording not one spot, but an array of spots in each data burst, the present invention makes possible recording and readout rates in excess of 1 Mb/sec. at extremely slow film transport speeds.

In the foregoing description of the recording and reproduction system of the present invention, specific parametric values and matters of design which may be appropriately selected by one skilled in the art depending upon the particular application of the invention, have not been set forth in detail, in order to keep the description of the invention concise. However, for purposes of information with respect to specific parametric details that may be chosen in implementing the invention, attention may be directed to the following publication: "FINAL TECHNICAL REPORT, Vol. II, DIGIMEM, OPTICAL MASS MEMORY INVESTIGATIONS, CONTRACT NO. MAS8-30564, June 1977, for George C. Marshall Space Flight Center, National Aeronautics and Space Administration, Marshall Space Flight Center, Ala. 38512, by Electro-Optics Department, Harris Corporation, Melbourne, Fl.," which report is incorporated herein by reference.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. An optical recording and reproducing apparatus comprising:
    first means for generating a first beam of light and directing said first beam of light onto a recording medium;
    second means, disposed in the path of said first beam of light, for selectively modulating said first beam of light with a plurality of channels of information and imaging said plurality of channels of information to be recorded onto said recording medium so as to form an image of said plurality of channels of information thereon;
    third means for directing a second beam of light onto said recording medium and thereby illuminating the recorded image of said plurality of channels of information which have been imaged and recorded thereon so as to project, via said second beam of light, the image of the plurality of channels of information recorded on said recording medium; and
    fourth means, disposed in the path of said second beam of light, for receiving the image projected by said third means and converting said image into an electrical signal representative of said information, while permitting variations in the location of incidence of said projected image thereon.

2. An optical recording and reproducing apparatus according to claim 1, further comprising:
    fifth means, disposed in the path of said second beam of light, for detecting variations in the direction of projection of said image relative to an intended direction of incidence upon said fourth means and for modifying the direction of projection of said image in response to the detection of a variation in the direction of projection of said image relative to said intended direction.

3. An optical recording and reproducing apparatus according to claim 2, further comprising
    sixth means for recording on said recording medium, at a location adjacent to the recording of said image of said plurality of channels of information, a recording position track by way of which the direction of projection of said image relative to said intended direction may be detected by said fifth means.

4. An optical recording and reproducing apparatus according to claim 1, further including fifth means, disposed adjacent to said recording medium, for substantially frictionlessly supporting said recording medium by means of a fluid bearing which is coupled to said recording medium in a thermodynamically non-throttling manner.

5. An optical recording and reproducing apparatus according to claim 2, further including fifth means, disposed adjacent to said recording medium, for substantially frictionlessly supporting said recording medium by means of a fluid bearing which is coupled to said recording medium in a thermodynamically non-throttling manner.

6. An optical recording and reproducing apparatus according to claim 5, further comprising
    sixth means for recording on said recording medium, at a location adjacent to the recording of said image of said plurality of channels of information, a recording position track by way of which the direction of projection of said image relative to said intended direction may be detected by said fifth means.

7. An optical recording and reproducing apparatus according to claim 1, wherein said second means comprises a multi-channel page composer which selectively modulates a plurality of spatially parallel portions of said first beam in accordance with said plurality of channels of information the image of which is to be recorded in parallel adjacent positions on said recording member.

8. An optical recording and reproducing apparatus according to claim 7, wherein said second means includes means for causing said page composer to modulate a prescribed portion of said first beam, spaced apart from said spatially parallel portions of said first beam by a distance greater than the extent of at least one of said parallel portions, with preselected information, and further including fifth means, disposed in the path of said second beam of light, for detecting exclusively the image produced by the modulated prescribed portion of said first beam and being coupled to said fourth means to control the generation of said electrical signal in accordance with the detection of the image produced by the modulated prescribed portion of said first beam.

9. An optical recording and reproducing apparatus according to claim 7, wherein said second means comprises means for serially receiving data signals and coupling said data signals to said page composer in parallel groups to thereby cause the selective modulation of said plurality of spatially parallel portions of said first beam.

10. An optical recording and reproducing apparatus according to claim 9, wherein said fourth means includes means for converting said image into said output signals corresponding to the data signals serially received by said second means.

11. An optical recording and reproducing apparatus according to claim 10, wherein said second means includes means for causing said page composer to modulate a prescribed portion of said first beam, spaced apart from said spatially parallel portions of said first beam by a distance greater than the extent of at least one of said parallel portions, with preselected information, and further including fifth means, disposed in the path of said second beam of light, for detecting exclusively the image produced by the modulated prescribed portion of said first beam and being coupled to said fourth means to control the generation of said serial output signals in accordance with the detection of the image produced by the modulated prescribed portion of said first beam.

12. An optical recording and reproducing apparatus comprising:
   first means for generating a first beam of light and directing said first beam of light onto a recording medium;
   second means, disposed in the path of said first beam of light, for selectively modulating said first beam of light with information to be recorded and imaging said information to be recorded onto said recording medium so as to form an image of said information thereon;
   third means for directing a second beam of light onto said recording medium and thereby illuminating the recorded image of said information so as to project, via said second beam of light, the image of the information recorded on said recording medium;
   fourth means, disposed in the path of said second beam of light, for receiving the image projected by said third means and converting said image into an electrical signal representative of said information, while permitting variations in the location of incidence of said projected image thereon; and
   fifth means, disposed adjacent to said recording medium, for substantially frictionlessly supporting said recording medium by means of a fluid bearing which is coupled to said recording medium in a thermodynamically non-throttling manner.

13. An optical recording and reproducing apparatus according to claim 12, further comprising
   sixth means, disposed in the path of said second beam of light, for detecting variations in the direction of propagation of said image relative to an intended direction of incidence upon said fourth means and for modifying the direction of propagation of said image in response to the detection of a variation in the direction of propagation of said image relative to said intended direction.

14. An optical recording and reproducing apparatus according to claim 13, further comprising seventh means for recording on said recording medium, at a location adjacent to the recording of said image of said information, a recording position track by way of which the direction of projection of said image relative to said intended direction may be detected by said sixth means.

15. An optical recording and reproducing apparatus according to claim 12, wherein said fourth means comprises an array of photodetector elements, the effective photodetection area of which is greater than the area of the image of said information projected thereon by said third means.

16. An optical recording apparatus comprising:
   first means for generating a beam of light and directing said beam of light onto a recording medium;
   second means, disposed in the path of said beam of light, for selectively modulating said beam of light with a plurality of channels of information and imaging said plurality of channels of information to be recorded onto said recording medium so as to form an image of said plurality of channels of information thereon; and
   third means, disposed adjacent to said recording medium, for substantially frictionlessly supporting said recording medium by means of a fluid bearing which is coupled to said recording medium in a thermodynamically non-throttling manner.

17. An optical recording apparatus according to claim 16, further comprising fourth means for recording on said recording medium, at a location adjacent to the recording of said image of said plurality of channels of information, a recording position track relative to which said plurality of channels of information are located on said recording medium.

18. An optical recording apparatus according to claim 16, wherein said second means comprises a multi-channel page composer which selectively modulates a plurality of spatially parallel portions of said first beam in accordance with said plurality of channels of information to be imaged and recorded in parallel adjacent positions on said recording member.

19. An optical recording apparatus according to claim 18, wherein said second means comprises means for serially receiving data signals and coupling said data signals to said page composer in parallel groups to thereby cause the selective modulation of said plurality of spatially parallel portions of said first beam.

20. An optical reproducing apparatus comprising:
   first means for directing a beam of light onto a recording medium having an image of information to be read out recorded thereon and thereby illuminating said recorded information so as to project, via said beam of light, said recorded image of the information to be read out from said recording medium;
   second means, disposed in the path of said beam of light, for receiving the image of said recorded information to be read out projected by said first means and converting said image into an electrical signal representative of said information, while permitting variations in the location of incidence of said projected image beam; and
   third means, disposed adjacent to said recording medium, for substantially frictionlessly supporting said recording medium by means of a fluid bearing which is coupled to said recording medium in a thermodynamically non-throttling manner.

21. An optical reproducing apparatus according to claim 20, wherein the image of the information recorded on said recording medium is in the form of the image of a plurality of parallel data modulations and wherein said second means includes means for converting said image into a series of output signals representative of said parallel data modulations.

22. An optical reproducing apparatus according to claim 21, wherein said recording medium further has recorded thereon a data positioning track relative to which the image of said plurality of parallel data modulations are located, and further including fourth means, disposed in the path of said beam of light, for controlling the direction of projection of said image in accordance with the position of the image of said data positioning track relative to the optical axis of said beam.

23. An optical reproducing apparatus comprising:
   first means for directing a beam of light onto a recording medium having an image of information to be read out recorded thereon and thereby illuminating said recorded information so as to project, via said beam of light, said recorded image of the information to be read out from said recording medium;
   second means, disposed in the path of said beam of light, for receiving the image of said recorded information to be read out projected by said first means and converting said image into an electrical signal representative of said information while permitting variations in the location of incidence of said projected image thereon; and third means, disposed in the path of said beam of light, for detecting variations in the direction of propagation of said image relative to an intended direction of incidence upon said second means and for modifying the direction of propagation of said image in response to the detection of a variation in the direction of propagation of said image relative to said intended direction.

24. An optical reproducing apparatus according to claim 23, wherein said fourth means comprises an array of photodetector elements, the effective photodetection area of which is greater than the area of the image of said information projected thereon by said third means.

25. An optical reproducing apparatus according to claim 23, wherein said recording medium further has recorded thereon a data position track relative to which the image of said recorded information is located, and wherein said third means includes means, disposed in the path of said beam of light, for controlling the direction of projection of said image in accordance with the position of said image of said data processing track relative to the optical axis of said beam.

26. An optical reproducing apparatus according to claim 23, further comprising fourth means, disposed adjacent to said recording medium, for substantially frictionlessly supporting said recording medium by means of a fluid bearing which is coupled to said recording medium in a thermodynamically non-throttling manner.

* * * * *